(12) United States Patent  
Park

(10) Patent No.: US 8,390,075 B2
(45) Date of Patent: Mar. 5, 2013

(54) SEMICONDUCTOR MEMORY DEVICES AND METHODS OF FABRICATING THE SAME

(75) Inventor: Weon-ho Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 338 days.

(21) Appl. No.: 12/588,717

(22) Filed: Oct. 26, 2009

(65) Prior Publication Data

US 2010/0109093 A1    May 6, 2010

(30) Foreign Application Priority Data

Nov. 4, 2008    (KR) ........................ 10-2008-0109034

(51) Int. Cl.
*H01L 27/115* (2006.01)
(52) U.S. Cl. ......... 257/379; 257/314; 257/324; 257/529
(58) Field of Classification Search .................. 257/379, 257/314, 324, 529
See application file for complete search history.

(56) References Cited

U.S. PATENT DOCUMENTS

2006/0006452 A1* 1/2006 Park et al. .................... 257/314

FOREIGN PATENT DOCUMENTS

| JP | 2006-245177 | 9/2006 |
| KR | 10-0471187 | 2/2005 |
| KR | 10-0518577 | 9/2005 |

OTHER PUBLICATIONS

An English language abstract of Korean Publication No. KR 10-2004-0067597, published Jul. 30, 2004.
An English language abstract of Korean Publication No. KR 10-2004-0101657, published Dec. 3, 2004.

* cited by examiner

*Primary Examiner* — Long Pham
(74) *Attorney, Agent, or Firm* — Harness, Dickey & Pierce, P.L.C.

(57) ABSTRACT

Semiconductor memory devices and methods of fabricating the semiconductor memory devices are provided, the semiconductor memory devices may include a one-time-programmable (OTP) cell and an electrically erasable programmable read-only memory (EEPROM). The OTP cell includes a memory transistor and a program transistor. The program transistor may include a fuse electrode and may be spaced apart from the memory transistor. The EEPROM cell includes a memory transistor including a first gate and a selection transistor including a second gate. The OTP cell includes a first high-density impurity region which overlaps with the fuse electrode.

14 Claims, 8 Drawing Sheets

SEMICONDUCTOR MEMORY DEVICES AND METHODS OF FABRICATING THE SAME

CROSS-REFERENCE TO RELATED APPLICATIONS

This application claims the benefit of priority under 35 U.S.C. §119 from Korean Patent Application No. 10-2008-0109034, filed on Nov. 4, 2008, in the Korean Intellectual Property Office, the disclosure of which is incorporated herein in its entirety by reference.

BACKGROUND

1. Field

Example embodiments relate to semiconductor memory devices and methods of fabricating the same. Other example embodiments relate to semiconductor memory devices fabricated using a simpler method and having a higher reliability and methods of fabricating the same.

2. Description of the Related Art

A semiconductor memory device having an electrically erasable programmable read-only memory (EEPROM) and a one-time-programmable (OTP) memory, which are nonvolatile memories, is frequently used in several fields (e.g., flat panel displays (FPDs)). The OTP memory refers to a memory in which data is written one time and is not erased, or programmed.

SUMMARY

Example embodiments relate to semiconductor memory devices and methods of fabricating the same. Other example embodiments relate to semiconductor memory devices fabricated using a simpler method and having a higher reliability and methods of fabricating the same.

Example embodiments relate to semiconductor memory devices fabricated using a simpler method and have higher reliability and methods of fabricating the semiconductor memory devices.

According to example embodiments, there is provided a semiconductor memory device including a one-time programmable (OTP) cell and an electrically erasable programmable read-only memory (EEPROM) cell. The OTP cell may include an OTP gate and a fuse electrode. The EEPROM cell may include a memory transistor having a first gate and a selection transistor having a second gate. The OTP cell includes a first high-density impurity region which overlaps with the fuse electrode.

The first high-density impurity region may have a density from about $1 \times 10^{16}$ ion/cm$^3$ to about $1 \times 10^{20}$ ion/cm$^3$. The first high-density impurity region may be entirely formed under the fuse electrode.

A second high-density impurity region may be formed under the first gate of the EEPROM cell. The conductive type of the second high-density impurity region may be the same as (or equivalent to) the conductive type of the first high-density impurity region. A junction depth of the first high-density impurity region may be equal to a junction depth of the second high-density impurity region.

A method of fabricating a semiconductor memory device including an OTP cell and an EEPROM cell includes defining first and second active regions wherein the OPT cell will be formed in the first active region, and the EEPROM cell will be formed in the second active region. A first insulating layer may be formed in the first and second active regions. An ion implantation mask is formed which exposes regions, in which a first high-density impurity region of the OPT cell in the first active region and a second high-density impurity region of the EEPROM cell in the second active region, will be respectively formed. Impurity ions may be implanted using the ion implantation mask to form the first and second high-density impurity regions. First and second gates of the EEPROM cell and a gate and a fuse electrode of the OTP cell may be formed. Source and drain regions may be formed to complete formation of a memory transistor in the OTP cell. Source and drain regions may also be formed to complete formation a memory transistor and a selection transistor in the EEPROM cell.

The method may include removing the ion implantation mask, and forming an etching mask to expose a region in which a gate insulating layer is to be formed. A portion of the first insulating layer positioned in the region exposed through the etching mask may be removed. A gate insulating layer may be formed on the region of a substrate, which is exposed through the removal of the first gate insulating layer. The gate insulating layer may be thinner than the first insulating layer. The exposed region of the substrate may be thermally oxidized to form the gate insulating layer.

The method may include forming a pocket region that encloses a drain region of the selection transistor of the EEPROM cell and has lower ion density than the drain region.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1A:
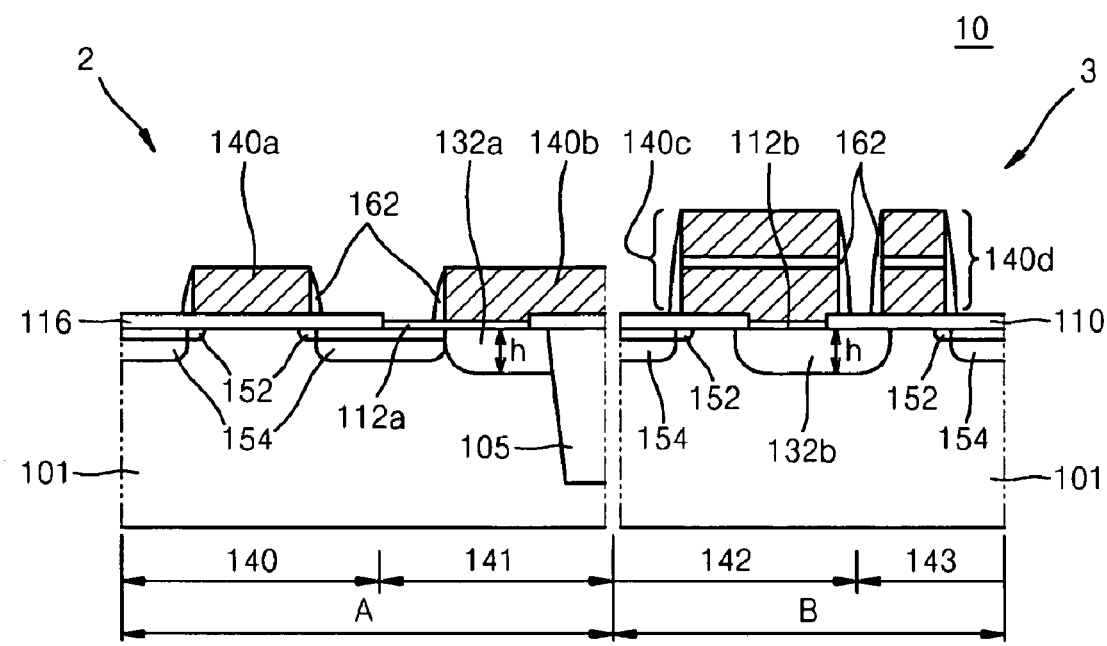
FIGS. 1A and 1B are cross-sectional views of semiconductor memory devices according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to semiconductor memory devices and methods of fabricating the same. Other example embodiments relate to semiconductor memory devices fabricated using a simpler method and having a higher reliability and methods of fabricating the same.

Example embodiments provide a semiconductor memory device including a one-time-programmable (OTP) cell and an electrically erasable programmable read-only memory (EEPROM) cell. The OTP cell includes an OTP gate and a fuse electrode, and the EEPROM cell includes a memory transistor having a first gate and a selection transistor having a second gate. The OTP cell includes a first high-density impurity region which overlaps with the fuse electrode.

Figure 1B:
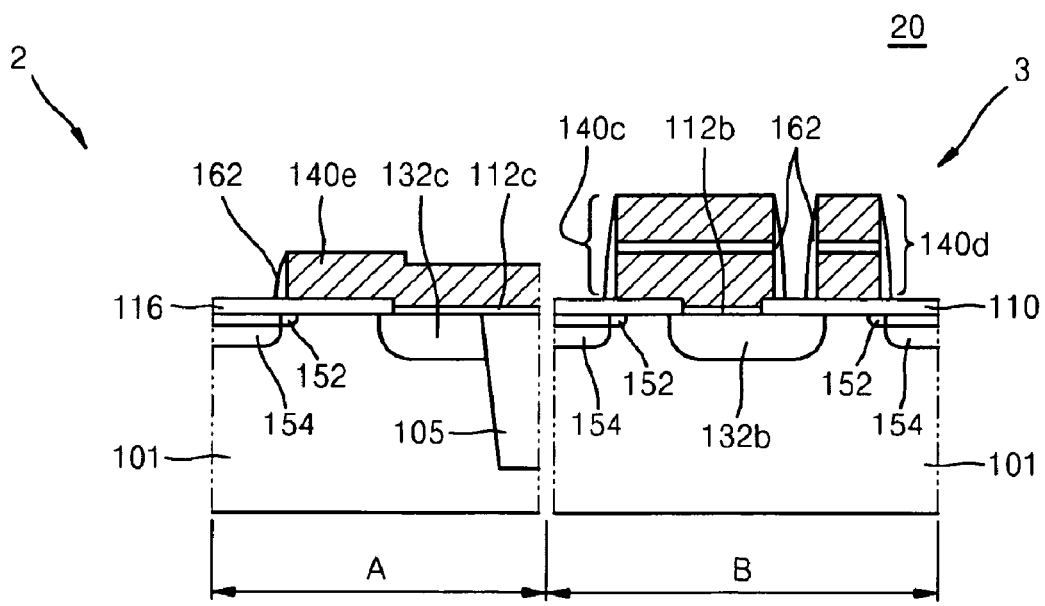

FIGS. 1A and 1B are cross-sectional views of semiconductor memory devices according to example embodiments.

In FIGS. 1A and 1B, a region in which the OTP cell is to be formed is referred to as a first active region "A", and a region in which the EEPROM cell is to be formed is referred to as a second active region "B".

Referring to FIG. 1A, a semiconductor device 10 according to example embodiments includes an OTP cell 2 and an EEPROM cell 3, both formed on a semiconductor substrate 101.

The OTP cell 2 includes a memory transistor 140 and a program transistor 141. The memory transistor 140 includes an OTP gate 140a. The program transistor 141 is spaced apart from the memory transistor 140 and includes a fuse electrode 140b. The fuse electrode 140b functions as a gate electrode before information is written in the OTP cell. The fuse electrode 140b may lose the function of the gate electrode due to a dielectric breakdown of an insulating layer positioned underneath the fuse electrode 140b, wherein the dielectric breakdown of the insulating layer is caused if the information is written. As such, the fuse electrode 140b may operate as the gate electrode herein but is referred to as a fuse electrode for convenience.

A first high-density impurity region 132a may be formed under the fuse electrode 140b in the first active region A. The first high-density impurity region 132a may have a n-type conductivity. However, example embodiments are not limited thereto. For instance, it should be appreciated that the conductive type of the first high-density impurity region 132a may be p-type.

N-type impurities (e.g., phosphorus (P), arsenic (As), antimony (Sb) or the like) may be implanted in the first high-density impurity region 132a. The density of the n-type impurities may be from about $1 \times 10^{16}$ ion/cm$^3$ to about $1 \times 10^{20}$ ion/cm$^3$.

As described above, in the semiconductor memory device 10 according to example embodiments, the fuse electrode 140b overlaps with the first high-density impurity region 132a in the OTP cell 2. As such, the OTP cell 2 has a substantially high on-cell current which has a narrow distribution, increasing the operational characteristics of the semiconductor memory device 10.

The EEPROM cell 3 includes a memory transistor 142 having a first gate 140c and a selection transistor 143 having a second gate 140d. A second high-density impurity region 132b may be formed under the first gate 140c. The second high-density impurity region 132b may function as a source (or drain) region that the memory and selection transistors 142 and 143 share with each other. A gate insulating layer 112b may be formed between the first gate 140c and the second high-density impurity region 132b. The gate insulating layer 112b may be thinner than a first insulating layer 110, which is formed as a gate insulating layer between a second gate 140d and a semiconductor substrate 101. The gate insulating layer 112b may have a thickness from about 6 nm to about 8 nm.

The first and second high-density impurity regions 132a and 132b have substantially the same junction depths "h." The first and second high-density impurity regions 132a and 132b may be formed through ion implantation processes that are simultaneously performed. However, example embodiments are not limited thereto. The first and second high-density impurity regions 132a and 132b may have the same conductive types.

An overlap degree between the fuse electrode 140b and the first high-density impurity region 132a is not limited. In other words, the fuse electrode 140b may overlap with a portion, or the entirety (or the whole portion), of the first high-density impurity region 132a. A gate insulating layer 112a is formed between the fuse electrode 140b and the first high-density impurity region 132a. The gate insulating layer 112a may be thinner than a second insulating layer 116 formed underneath the OTP gate 140a of the memory transistor 140 of the OTP cell 2. For example, the gate insulating layer 112a may have a thickness from about 1.5 nm to about 4 nm.

A source and/or drain region 154 may be formed between the OTP gate 140a and the fuse electrode 140b. The source and/or drain 154 may be adjacent to, or overlap with, the first high-density impurity region 132a.

The semiconductor memory device 10 shown in FIG. 1A includes a 1.5T type OTP cell. A semiconductor memory device 20 including a 1T type OTP cell according to example embodiments is shown in FIG. 1B.

Referring to FIG. 1B, a preliminary OTP gate and a fuse electrode are formed in a single body to form an OTP gate 140e. The OTP gate 140e has a step on an upper surface thereof. The step in the OTP gate 140e is generated by forming a second insulating layer 116 on a portion of a lower surface of the OTP gate 140e and a gate insulating layer 112c on another portion of the lower surface of the OTP gate 140e wherein the second insulating layer 116 has a larger thickness than the gate insulating layer 112c. The OTP gate 140e has the step difference due to a difference between the thicknesses of the second insulating layer 116 and the gate insulating layer 112c.

The gate insulating layer 112c may be dielectrically broken down while information is written in the OTP cell 2.

In the semiconductor memory device 20 of FIG. 1B, a portion of the OTP gate 140e corresponding to the fuse electrode overlaps with a first high-density impurity region 132c in the OTP cell 2. As such, the OTP cell 2 has a substantially high on-cell current which has a narrow distribution, increasing operational characteristics of the semiconductor memory device 20.

A method of fabricating a semiconductor memory device according to example embodiments will now be described.

FIGS. 2A through 2L are cross-sectional views illustrating a method of fabricating a semiconductor memory device according to embodiments.

Figure 2A:
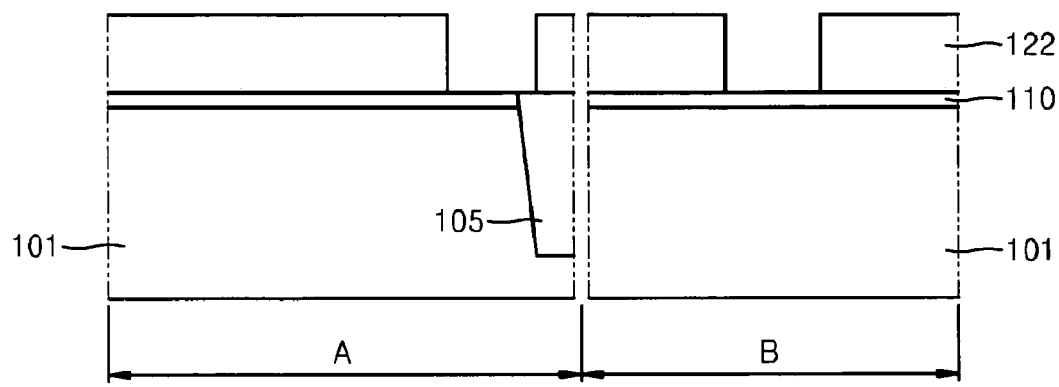
FIGS. 2A through 2L are cross-sectional views illustrating a method of fabricating a semiconductor memory device according to example embodiments.

Referring to FIG. 2A, first and second active regions "A" and "B" are defined on a semiconductor substrate 101. An isolation layer 105 may be formed to isolate cells from each other. A first insulating layer 110 may be formed of a pad oxide on an upper surface of the semiconductor substrate 101 in the first and second active regions "A" and "B."

An ion implantation mask 122 may be formed to expose portions in which first and second high-density impurity regions, respectively, will be formed. The first high-density impurity region will be formed in the first active region "A" in which an OTP cell 2 (shown in FIG. 2L) will be formed, and the second high-density impurity region will be formed in the second active region "B" in which an EEPROM cell 3 (shown in FIG. 2L) will be formed.

Figure 2B:
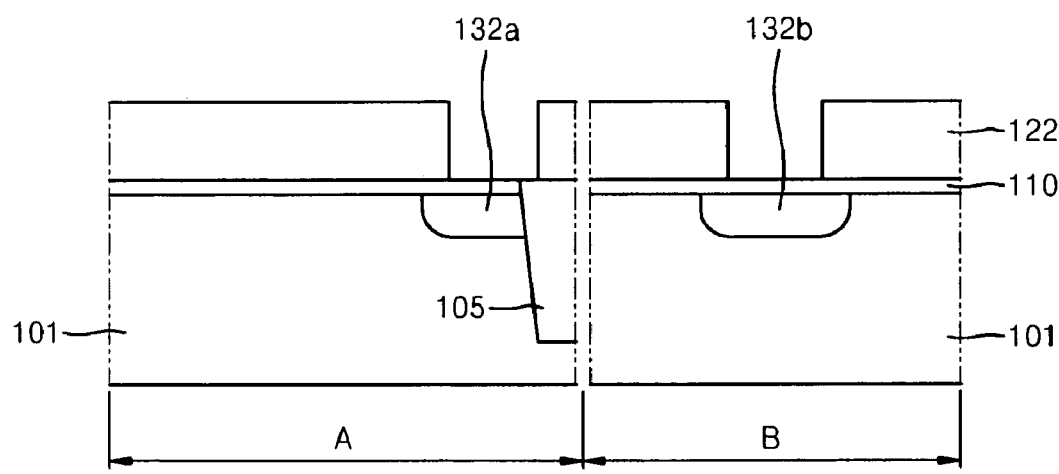

Referring to FIG. 2B, a set conductive type of impurity ions may be implanted into the portions exposed through the ion implantation mask 122. Here, the density of the impurity ions may be from about $1 \times 10^{16}$ ion/cm$^3$ to about $1 \times 10^{20}$ ion/cm$^3$. Any conductive type of impurity ions may be implanted into the exposed portions. Thus, the impurity ions are not limited to a specific conductive type. For example, n-type impurity ions (e.g., phosphorous (P), arsenic (As), antimony (Sb) or the like) may be implanted. For example, p-type impurity ions (e.g., indium (In), gallium (Ga), boron (B), aluminum (Al) or the like) may be implanted.

The implanted impurity ions may be diffused more widely than an opening of the ion implantation mask 122. Thus, a design of the ion implantation mask 122 and conditions of an ion implantation process may be determined in consideration of the diffusion of the impurity ions.

A first high-density region 132a and a second high-density impurity region 132b may be formed through the implantation of the impurity ions.

Figure 2C:
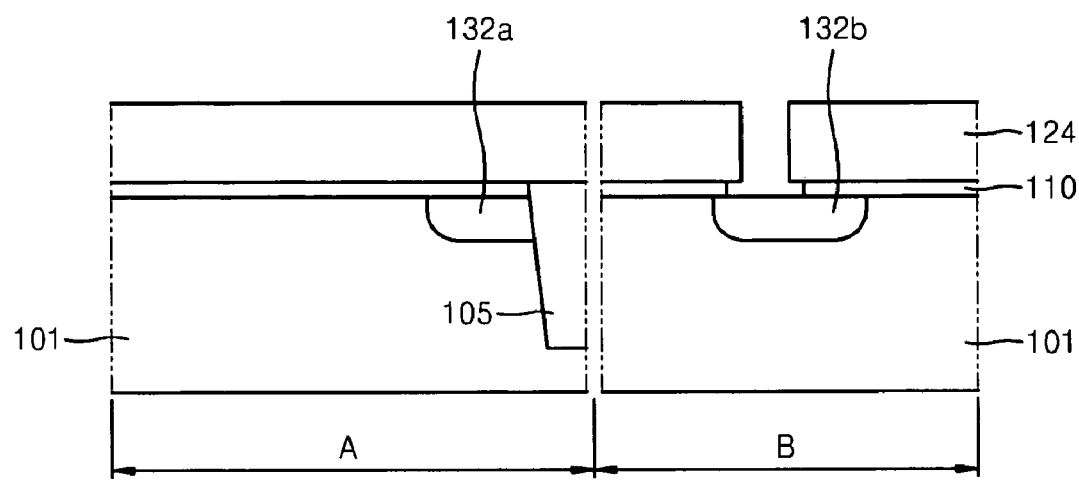

Referring to FIG. 2C, the ion implantation mask 122 may be removed and an etching mask 124 may be formed. The ion implantation mask 122 may be removed using an appropriate method depending on its material. For example, the ion implantation mask 122 may be removed by ashing. However, example embodiments are not limited thereto.

The etching mask 124 may expose a region in which a gate insulating layer of a first gate of the EEPROM cell 3 will be formed. A portion of the first insulating layer 110, which is positioned in the region in which the gate insulating layer of the first gate of the EEPROM cell will be formed, is removed (for example, using a wet etching method). If the wet etching method is used, a range of the removed portion of the first insulating layer 110 may be slightly wider than the opening of the etching mask 124. Thus, the etching mask 124 may be designed in consideration of this.

Figure 2D:
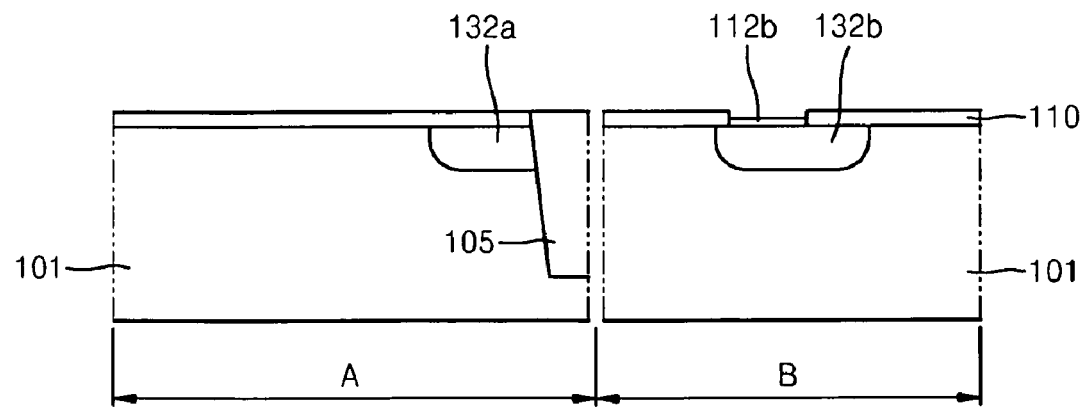

Referring to FIG. 2D, a gate insulating layer 112b of the first gate of the EEPROM cell 3 is formed and the etching mask 124 is removed. A method of forming the gate insulating layer 112b is not limited. For example, the gate insulating layer 112b may be formed using a thermally oxidizing method. The gate insulating layer 112b may have a thickness from about 6 nm to about 8 nm.

Figure 2E:
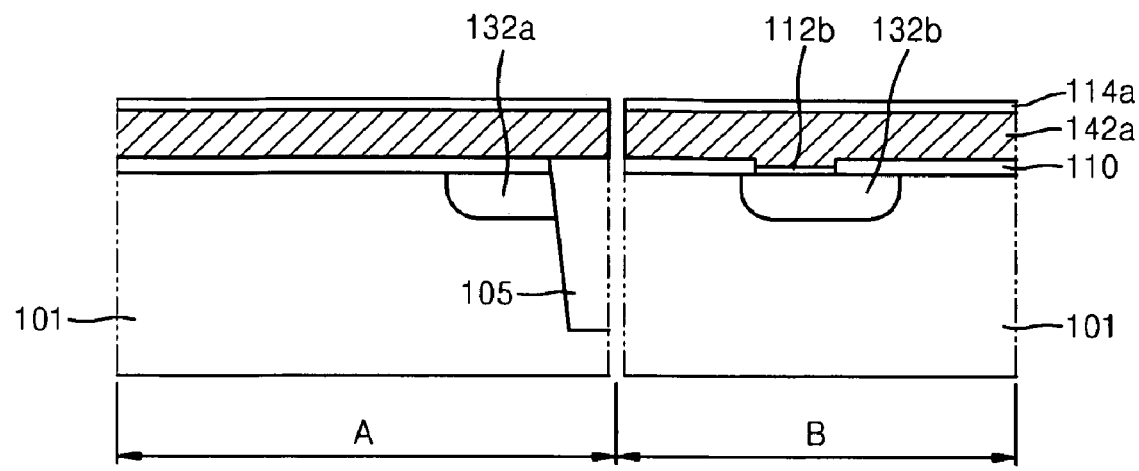

Referring to FIG. 2E, a first gate material layer 142a and an interlayer insulating material layer 114a may be formed on the first insulating layer 110, the device isolation region 105 and the second high-impurity region 132b to form a gate of the EEPROM cell 3. The first gate material layer 142a may be formed of a conductive material. However, the material of the first gate material layer 142a is not limited. For example, the first gate material layer 142a may be formed of polysilicon, metallic nitrides (e.g., tantalum nitride or tungsten nitride) or metallic oxynitrides (e.g., titanium oxynitride or tungsten oxynitride). The first gate material layer 142a may be formed using chemical vapor deposition (CVD) or physical vapor deposition (PVD) (e.g., sputtering). However, the method of forming the first gate material layer 142a is not limited thereto, and various methods may be used to form the first gate material layer 142a.

The interlayer insulating material layer 114a may be formed of a material having an insulation characteristic. However, the material of the interlayer insulating material layer 114a is not limited. In particular, the interlayer insulating material layer 114a may be a single layer formed of at least one type of material or may include multiple layers (e.g., an ONO layer formed of a stack of oxide, nitride and oxide materials). The interlayer insulating material layer 114a may be formed using CVD or PVD (e.g., sputtering). However, the method of forming the interlayer insulating layer 114a is not limited. Various methods may be used to form the interlayer insulating material layer 114a.

Figure 2F:
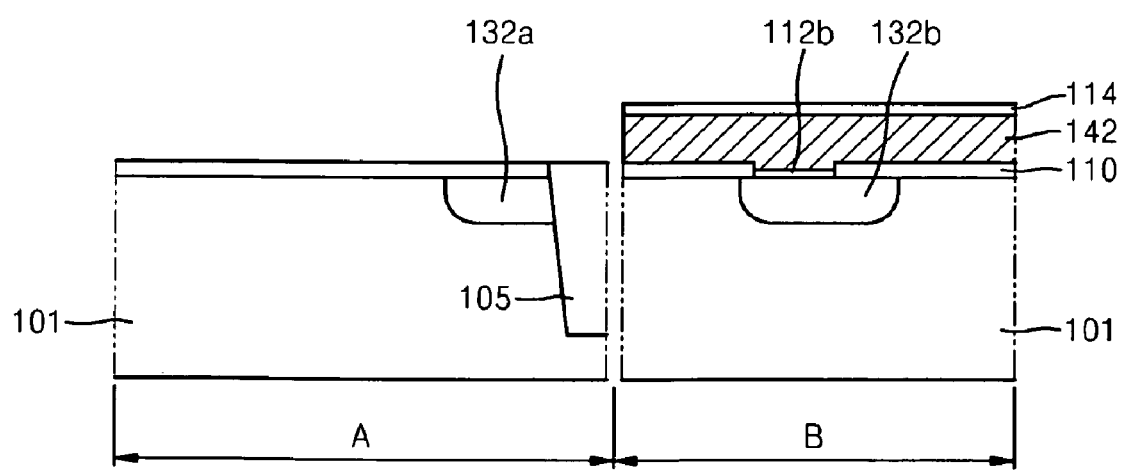

Referring to FIG. 2F, a portion of the first gate material layer 142a and the interlayer insulating material layer 114a may be removed from a first active region "A" to form a first gate layer 142 and an interlayer insulating layer 114 in the EEPROM cell 3 (i.e., in a second active region "B"). A method of removing the first gate material layer 142a and the interlayer insulating material layer 114a is not limited. For example, after the second active region "B" is covered with a mask (not shown), the first gate material layer 142a and the interlayer insulating material layer 114a may be removed using an etchback method or the like.

Figure 2G:
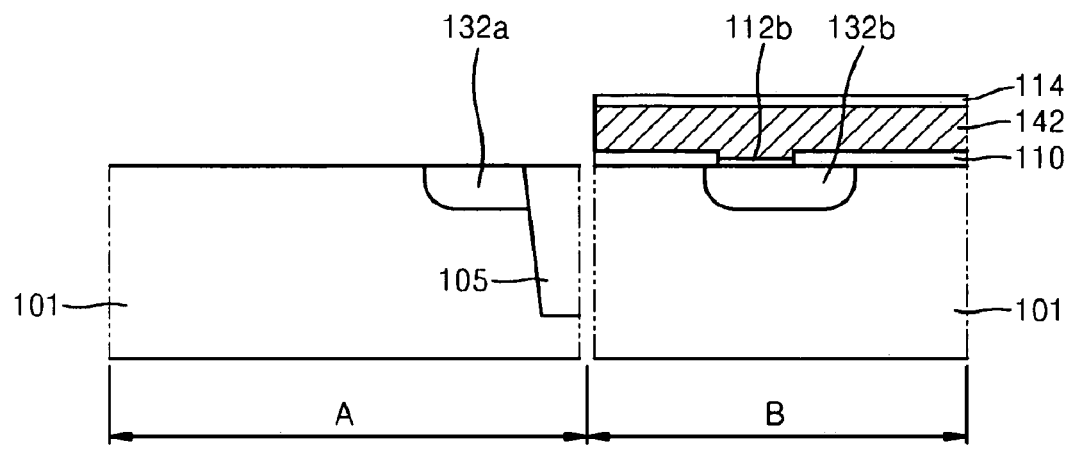

Referring to FIG. 2G, the first insulating layer 110 may be removed from the first active region "A." The first insulating layer 110 may be removed using an etchback method. However, the method of removing the first insulating layer 110 is not limited thereto. A portion of the isolation layer 105 may be removed if the first insulating layer 110 is removed.

Figure 2H:
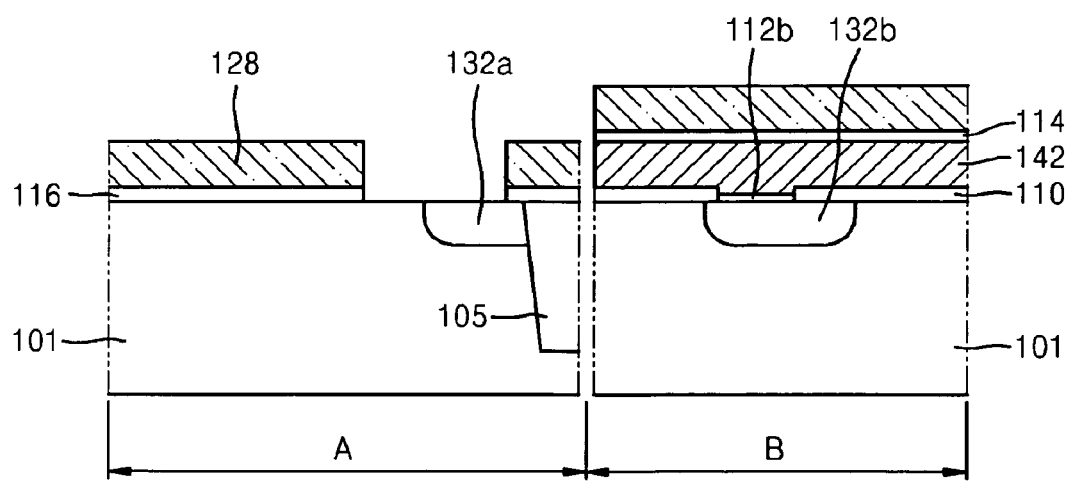

Referring to FIG. 2H, a second insulating layer 116 may be formed on an entire (or whole) surface of the semiconductor substrate 101 in the first active region "A." The second insulating layer 116 may be formed using a CVD method. The second insulating layer 116 may be formed with a denser structure than the first insulating layer 110. The second insulating layer 116 may be formed to expose a portion of an upper surface of the first high-density impurity region 132a and the semiconductor substrate 101.

In order to expose a portion of an upper surface of the first high-density impurity region 132a and the semiconductor substrate 101, an etching mask may be formed on the second insulating layer 116. The etching mask may expose a region in which a gate insulating layer of a fuse gate of the OTP cell 2 will be formed. A portion of the second insulating layer 116, which is positioned in the region in which the gate insulating layer of the fuse gate of the OTP cell 2 will be formed, is removed (for example, using a wet etching method). If the wet etching method is used, a range of the removed portion of the second insulating layer 116 may be slightly wider than the opening of the etching mask. Thus, the etching mask may be designed in consideration of this.

The OTP cell 2 may use the first insulating layer 110 without having to form the second insulating layer 116. However, if the first insulating layer 110 does not have a characteristic enough to operate as a gate insulating layer of a memory transistor of the OTP cell, the first insulating layer 110 may be removed and the second insulating layer 116 may be appropriately formed.

Figure 2I:
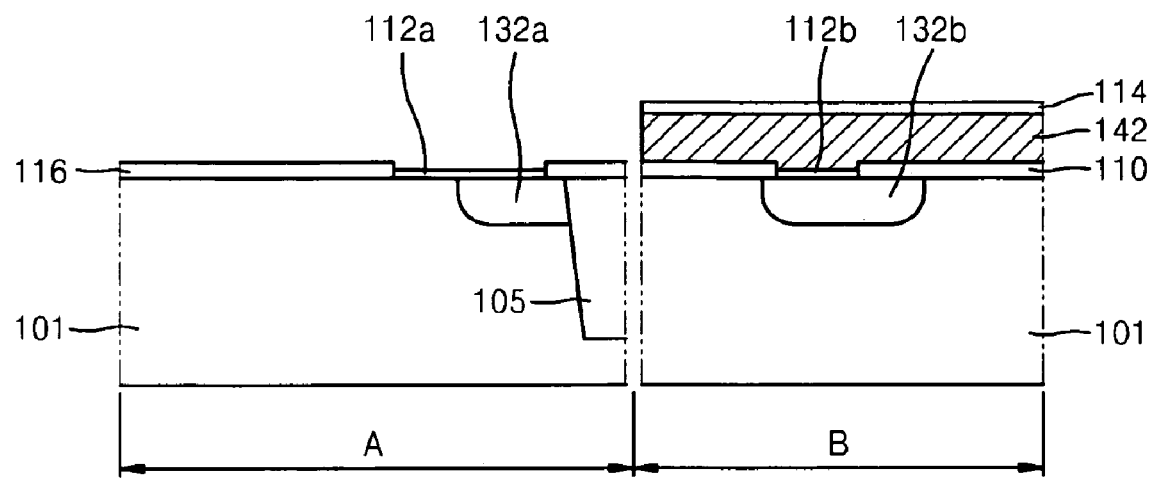

Referring to FIG. 2I, a gate insulating layer 112a of a program transistor 141 of the OTP cell 2 is thinly formed on the exposed portion, and the etching mask is removed. As previously described, the program transistor 141 may not operate as a transistor due to a dielectric breakdown of the gate insulating layer 112a caused if information is written. For convenience, the program transistor 141 is referred to as a program transistor herein. The gate insulating layer 112a may be thinner than the first insulating layer 110 or the second insulating layer 116. For example, the gate insulating layer 112a may have a thickness from 1.5 nm to 4 nm.

The gate insulating layer 112a may be formed of silicon oxide. The gate insulating layer 112a may be formed using a thermal oxidization method.

Figure 2J:
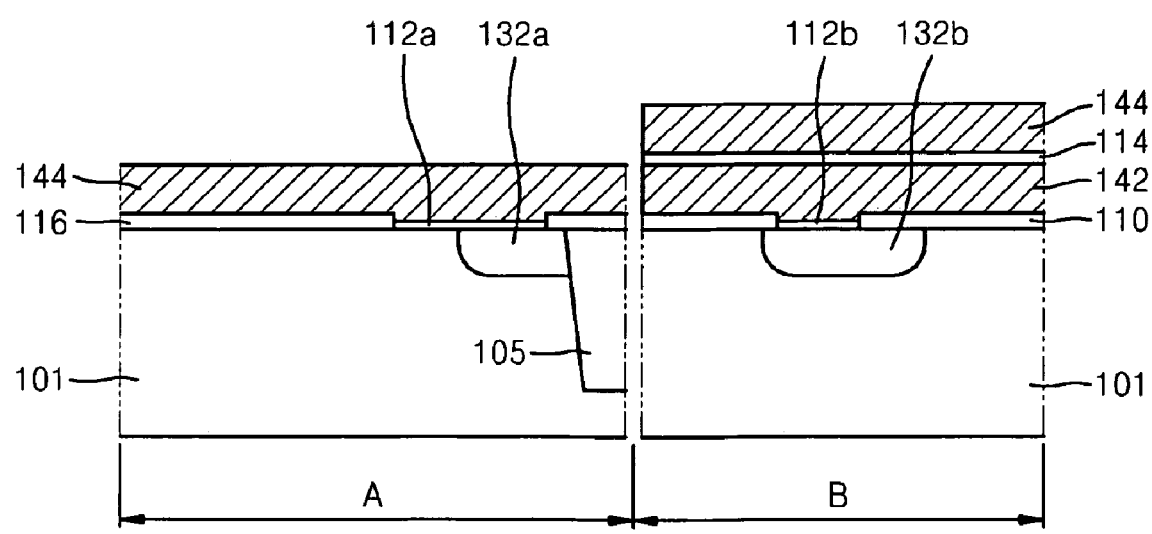

Referring to FIG. 2J, a second gate material layer 144 is formed above the whole (or entire) surface of the semiconductor substrate 101 in the first and second active regions "A" and "B." The second gate material layer 144 may be formed of the same material as the first gate material layer 142. The second gate material layer 144 may be formed using the same method as that by which the first gate material layer 142 has been formed.

Figure 2K:
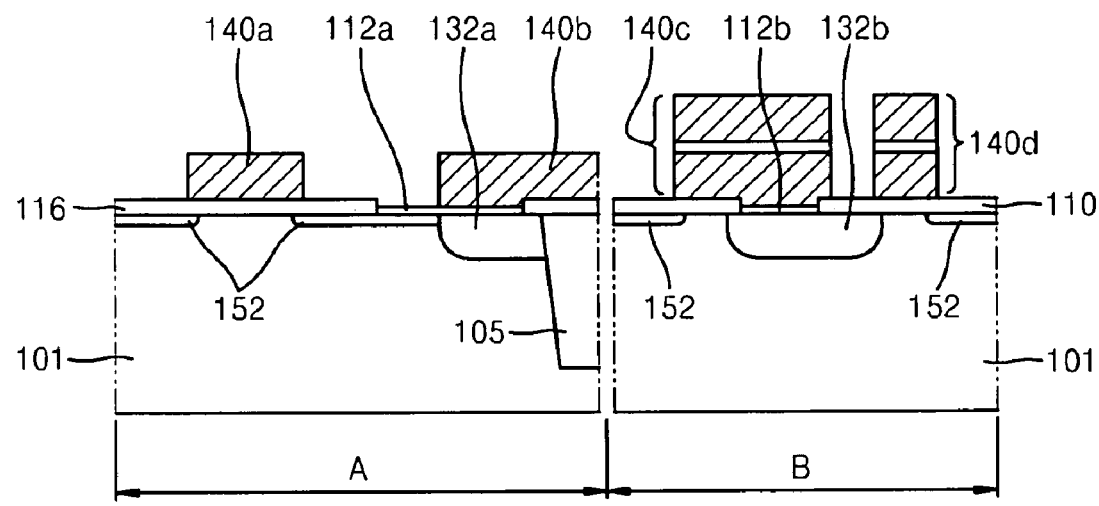

Referring to FIG. 2K, the second gate material layer 144 in the first active region "A" and the first gate material layer 142, the interlayer insulating layer 114, and the second gate material layer 144 in the second active region "B" may be etched to form an OTP gate 140a and a fuse electrode 140b of the OTP cell 2 and first and second gates 140c and 140d of the EEPROM cell 3.

An etching mask may be formed using a photoresist layer, or a hard mask may be formed of a material (i.e., silicon nitride) to etch the second gate material layer 144, the first gate layer 142 and the interlayer insulating layer 114. Anisotropic etching may be performed to etch the second gate material layer 144, the first gate layer 142 and the interlayer insulating layer 114.

A set conductive type of impurity ions are implanted using the OTP gate 140a and the fuse electrode 140b of the OTP cell 2 and the first and second gates 140c and 140d of the EEPROM cell 3 as ion implantation masks.

Figure 2L:
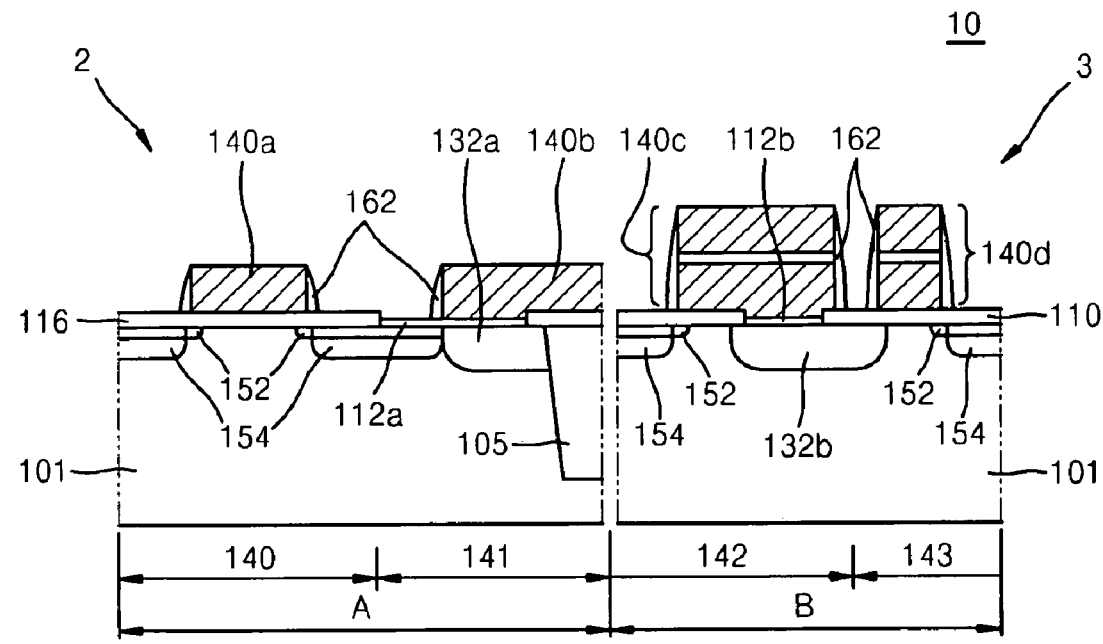

Referring to FIG. 2L, spacers 162 may be formed on sidewalls of the OTP gate 140a and the fuse electrode 140b of the OTP cell 2 and the first and second gates 140c and 140d of the EEPROM cell 3. Impurity ions may be additionally implanted after the spacers 162 are formed. The impurity ions are doped at a low density before the spacers 162 are formed and then at a high density after the spacers 162 are formed, to form ion implantation regions 152 and 154.

Figure 3A:
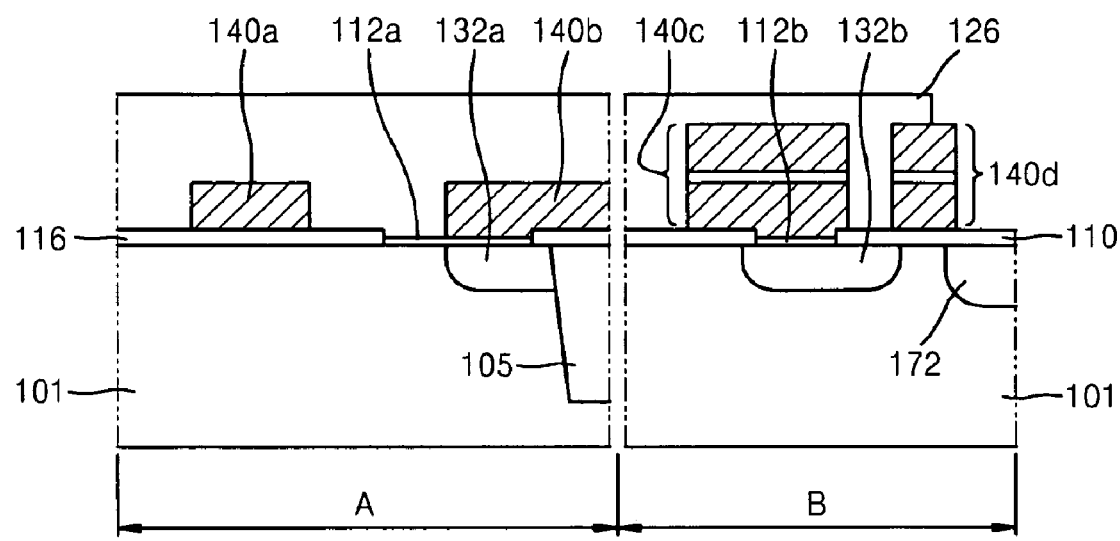
FIGS. 3A and 3B are cross-sectional views illustrating a method of fabricating a semiconductor memory device according to example embodiments.
Figure 3B:
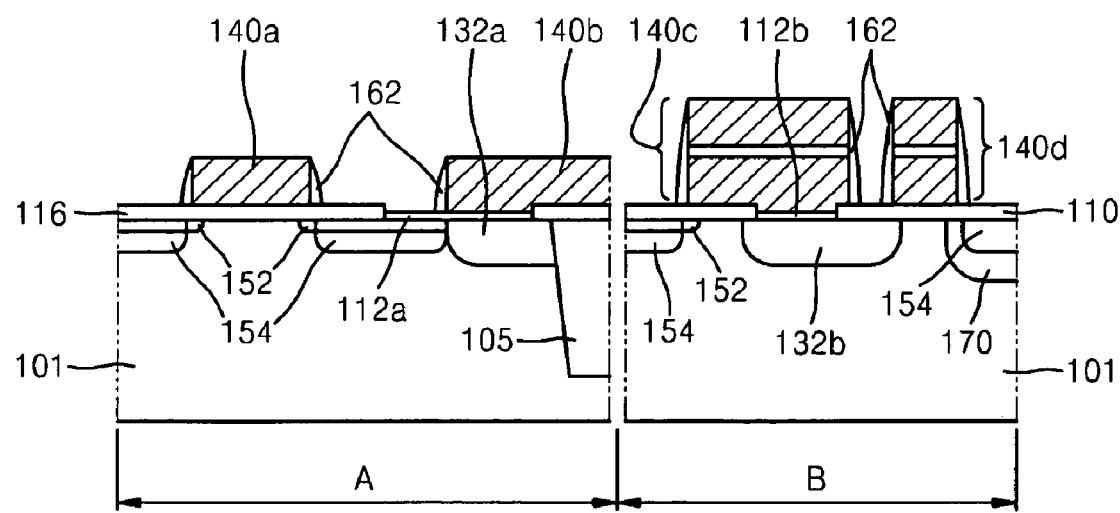

FIGS. 3A and 3B are cross-sectional views illustrating a method of fabricating a semiconductor memory device according to example embodiments.

Referring to FIG. 3A, the OTP gate 140a and the fuse electrode 140b of the OTP cell 2 and the first and second gates 140c and 140d of the EEPROM cell 3 may be formed using the etching process described in connection with FIG. 2K.

A mask 126 may be formed to expose a drain region of a selection transistor 143 of the EEPROM cell 3. Low-density impurities may be implanted at substantially high energy to form a pocket 170.

Referring to FIG. 3B, the mask 126 may be removed and a set conductive type of impurity ions may be implanted using the OTP gate 140a and the fuse electrode 140b of the OTP cell 2 and the first and second gates 140c and 140d of the EEPROM cell 3 as ion implantation masks to form source and drain regions 152 and 154 of the OTP cell 2 and the EEPROM cell 3.

The semiconductor memory device 20 illustrated with reference to FIG. 1B may be easily fabricated using the method described with reference to FIGS. 2A through 2L.

As described above, according to example embodiments, a semiconductor memory device simultaneously including an OTP cell and an EEPROM cell is fabricated. A high-density impurity region may be formed under a fuse electrode of the OTP cell. The high-density impurity region may have the same junction depth as a high-density impurity region of the EEPROM cell. As such, the semiconductor memory device may be fabricated using a simpler method. The OTP cell may have a substantially high on-cell current which has a narrow distribution, increasing operational characteristics of the semiconductor memory device. As such, a semiconductor memory device having higher reliability may be fabricated using a simpler method.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
    an one-time-programmable (OTP) cell including an OTP gate, a fuse electrode, a first high-density impurity region that overlaps with the fuse electrode and a first gate insulating layer between the fuse electrode and the first high-density impurity region; and
    an electrically erasable programmable read-only memory (EEPROM) cell including a memory transistor having a first gate, a selection transistor having a second gate, a second high-density impurity region that overlaps with the first gate and the second gate and a second gate insulating layer between the first gate and the second high-density impurity region,
    wherein the first gate insulating layer has a thickness in the range from 1.5 nm to 4 nm, and the second gate insulating layer has a thickness in the range from 6 nm to 8 nm.

2. The semiconductor memory device of claim 1, wherein the first high-density impurity region has a density from about $1\times10^{16}$ ion/cm$^3$ to about $1\times10^{20}$ ion/cm$^3$.

3. The semiconductor memory device of claim 1, wherein the first high-density impurity region is entirely under the fuse electrode.

4. The semiconductor memory device of claim 1, wherein the second high-density impurity region is under the first gate of the EEPROM cell.

5. The semiconductor memory device of claim 4, wherein the second high-density impurity region has the same conductive type as that of the first high-density impurity region.

6. The semiconductor memory device of claim 5, wherein the first high-density impurity region has a junction depth substantially equal to that of the second high-density impurity region.

7. The semiconductor memory device of claim 4, wherein the first high-density impurity region has a junction depth substantially equal to that of the second high-density impurity region.

8. The semiconductor memory device of claim 4, wherein the second high-density impurity region is under the first gate and the second gate of the EEPROM cell.

9. The semiconductor memory device of claim 1, wherein the OTP gate includes the fuse electrode and a preliminary OTP gate.

10. The semiconductor memory device of claim 9, wherein the OTP gate has a stepped configuration.

11. The semiconductor memory device of claim 10, wherein an upper surface of the OTP gate has the stepped configuration.

12. The semiconductor memory device of claim 1, wherein the EEPROM cell includes a source region under the memory transistor, a drain region under the selection transistor and a pocket region that encloses the drain region.

13. The semiconductor memory device of claim 12, wherein the pocket region has a lower impurity density than the drain region.

14. The semiconductor memory device of claim 9, wherein the fuse electrode and the preliminary OTP gate collectively form a single body.

* * * * *